(12) United States Patent
Christ

(10) Patent No.: US 7,994,953 B2
(45) Date of Patent: Aug. 9, 2011

(54) METHOD AND MODULE WITH ANALOG-TO-DIGITAL CONVERTER

(75) Inventor: Volker Christ, Neuss (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/339,916

(22) Filed: Dec. 19, 2008

(65) Prior Publication Data

US 2010/0156681 A1 Jun. 24, 2010

(51) Int. Cl.
*H03M 1/10* (2006.01)
(52) U.S. Cl. ........................ 341/120; 341/155
(58) Field of Classification Search ............... 341/118, 341/120, 169, 155; 702/32
See application file for complete search history.

(56) References Cited

U.S. PATENT DOCUMENTS

| 6,299,465 | B1 | 10/2001 | Hirata |
| 6,333,706 | B1 * | 12/2001 | Cummings et al. ........... 341/120 |
| 6,549,150 | B1 * | 4/2003 | Bulaga et al. ................ 341/120 |
| 6,557,131 | B1 * | 4/2003 | Arabi .............................. 714/734 |
| 7,319,424 | B2 * | 1/2008 | Stewart ........................ 341/169 |
| 2006/0155486 | A1 * | 7/2006 | Walsh et al. ..................... 702/32 |

OTHER PUBLICATIONS

"A low-cost adaptive ramp generator for analog BIST applications", F. Azais, et al., VLSI test Symposium, 19th IEEE Proceedings on. VTS 2001, pp. 266-271.

* cited by examiner

*Primary Examiner* — Peguy JeanPierre
(74) *Attorney, Agent, or Firm* — Dicke, Billig & Czaja, PLLC

(57) ABSTRACT

A method and module with analog-to-digital converter. One embodiment provides for testing an analog-to-digital converter, including generating a voltage ramp. The voltage ramp is converted to a digital signal using the ADC at a rate of a clock signal. A first parameter is calculated according to the clock signal and the digital signal on the chip. The first parameter is indicative of conversion characteristics of the ADC.

20 Claims, 2 Drawing Sheets

METHOD AND MODULE WITH ANALOG-TO-DIGITAL CONVERTER

BACKGROUND

The invention relates to a method for testing an analog-to-digital converter and to a chip including an analog-to-digital converter and units for testing the analog-to-digital converter.

Analog signals may be converted to digital signals using an analog-to-digital converter. Analog-to-digital converters may convert analog signals to digital signals according to a characteristic response. The characteristic response may be tested to verify the accuracy and quality of the analog-to-digital converter.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
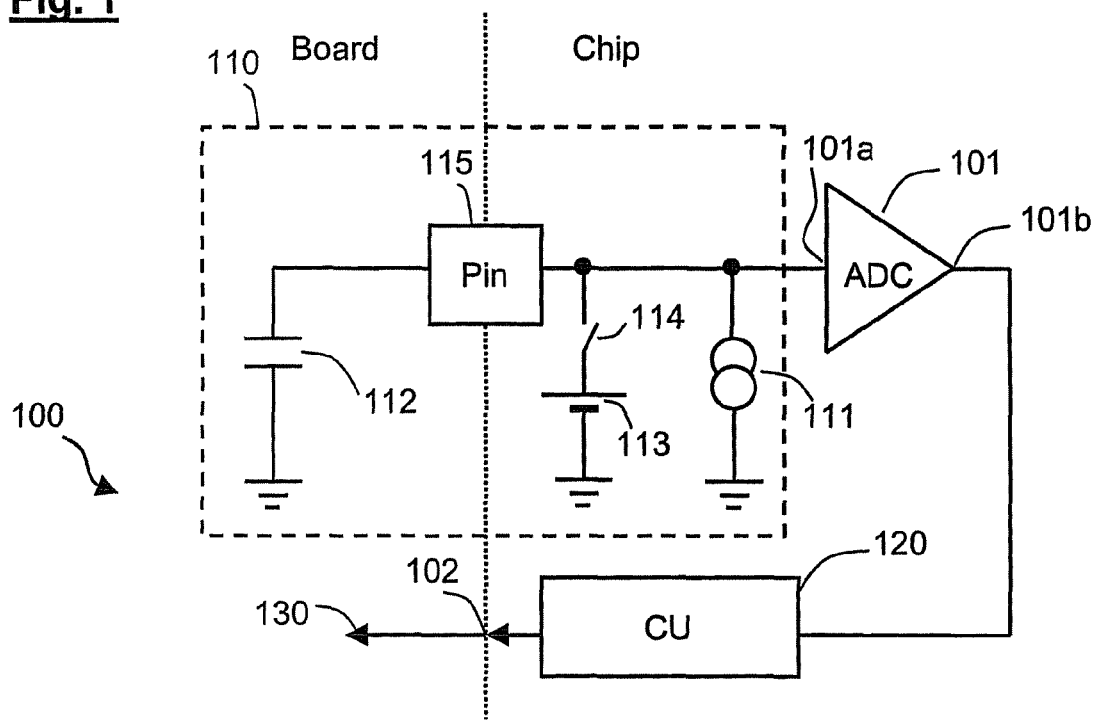
FIG. 1 schematically illustrates one embodiment of a module.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal.

The various aspects summarized may be embodied in various forms. The following description illustrates by way of illustration of various combinations and configurations in which the aspects may be practiced. It is understood that the described aspects and/or embodiments are merely examples, and that other aspects and/or embodiments may be utilized and structural and functional modifications may be made, without departing from the scope of the present disclosure.

Analog-to-digital converters (ADC) as referred to herein may convert analog input signals to digital output signals. ADCs may be arranged on chips of any type. Depending on the resolution and the gain of the ADC analog signals within a certain voltage range may be converted to a plurality of digital codes. The voltage range may be divided into smaller voltage steps wherein each voltage step is associated with one of the plurality of digital codes. The quality of the ADC may be assessed by testing the ADC. To this end, analog testing signals may be fed to the ADC and the resulting digital output signal compared to the analog testing signal. The relationship of an analog input signal to the digital output signal of an ADC may be referred to as characteristic curve.

The outcome of a testing run of an ADC may yield certain deviations from the ideal characteristic curve. The shape, quantity and magnitude of these deviations may allow to draw conclusions on the quality and/or functionality of the ADC under test.

FIG. 1 schematically illustrates a module 100 according to one embodiment. The module 100 includes a chip having an ADC 101 with an input 101a and an output 101b. The chip may further have a calculation unit 120 having an input coupled to the output 101b of the ADC. The chip may further have a pin 115 and an output 102, wherein the output 102 may be a pin as well. The chip may be mounted on a board, such as a PCB, a leadframe, a motherboard or similar device.

The module 100 may further have a generation unit 110 illustrated by the dashed line. The generation unit 110 may be partly implemented on the chip and partly outside the chip as illustrated in FIG. 1. In another embodiment, the generation unit 110 may also be arranged entirely outside the chip or entirely on the chip, i.e. the components constituting the generation unit 110 may either be arranged on the chip or off the chip. If the generation unit 110 is arranged entirely on the chip, the pin 115 may not be necessary. If the generation unit 110 is arranged entirely off the chip, the pin 115 may be arranged between the generation unit 110 and the ADC 101 and act as coupling device to couple signals output by the generation unit 110 into the input 101a of the ADC.

The generation unit 110 may include a DC current source 111 and a capacitor 112 coupled in parallel to the DC current source. As illustrated in FIG. 1 the DC current source 111 may be arranged on the chip. The capacitor 112 may be arranged off the chip, for example by coupling a capacitor 112 to the pin 115 of the chip when testing of the ADC is intended. However, it may also be provided for the capacitor 112 to be arranged on the chip. The capacitor 112 may have a linear charging characteristic and may have a capacitance of, for example, 1 nF or higher. The DC current source 111 may for example be a bandgap current source.

The DC current source 111 and the capacitor 112 may be used to provide a voltage ramp which may be input to the input 101*a* of the ADC 101. For example, the voltage ramp may be generated by starting at a discharged capacitor 112 which is gradually charged by the DC current source 111. The voltage ramp may for example be a linearly increasing voltage ramp. In one embodiment, the voltage ramp may have a voltage increase over time which allows for multiple ADC conversion cycles within one voltage step, i.e. the voltage ramp increases slowly enough to obtain the same digital code in the digital signal at the output 101*b* of the ADC 101 for a sequence of conversion cycles.

It should be noted, that other elements and components for producing a voltage ramp than a DC current source and a capacitor may be equally used. The embodiment of FIG. 1 is merely illustrated as example and other solutions for obtaining a voltage ramp are possible as well.

The generation unit 110 may further include a voltage source 113 and a switch 114. The voltage source 113 may be arranged in parallel to the capacitor 112 and the DC current source 111 and may be selectively coupled to the input 101*a* of the ADC 101 via the switch 114. The voltage source 113 and the switch 114 may be arranged on the chip as illustrated exemplarily in FIG. 1. In another embodiment, the voltage source 113 and the switch 114 may also be arranged off the chip. The voltage source 113 may be operated to generate a fixed voltage which may be supplied to the input 101*a* of the ADC 101. The voltage generated by the voltage source 113 may be used to calibrate internally generated parameters by a calculation unit 120, for example an offset of the ADC 101 which may be influenced by external conditions. The voltage source 113 may be configured to generate a plurality of different fixed voltages which may be successively supplied to the input 101*a* of the ADC 101. It should be noted that any component capable of generating fixed voltages may be used and the embodiment of FIG. 1 should not be regarded as limited to the voltage source 113 illustrated in FIG. 1.

The module 100 may include a calculation unit 120. The calculation unit 120 may be configured to receive digital signals output by the ADC 101 at the output 101*b* as input. The calculation unit 120 may further be coupled to the generation unit 110. The calculation unit 120 may be configured to calculate a plurality of parameters indicative of the conversion characteristics of the ADC 101. As an example, the calculation unit 120 may be configured to perform a linear regression on the analog input signal to the ADC 101 and the digital output signal of the ADC 101. The calculation unit 120 may be configured to output at least one of the plurality of parameters at an output 102 of the chip. The at least one of the plurality of parameters may then be passed on at 130 to external, i.e. off-chip units, for example testing equipment for the chip, a personal computer or any other device appropriate for processing the at least one of the plurality of parameters calculated by the calculation unit 120. The calculation unit 120 may include firmware or glue-logic components which are configured to drive the mathematical operations necessary to calculate the plurality of parameters in the calculation unit 120. The calculation unit 120 may include a register (not illustrated) configured to store for example values that have been calculated during the calculation of the plurality of parameters or pairs of values of the analog input signal and the digital output signal of the ADC 101.

In the following, an example is given how the calculation unit 120 may be configured to calculate parameters indicative of the conversion characteristics of the ADC 101. The example is not to be taken in a limiting sense, as other methods, algorithms or processes are equally usable when calculating parameters indicative of the conversion characteristics of the ADC 101.

To estimate a relationship between two variables performing a linear regression may be used. The relationship between two variables x and y may be assumed as $$y = a + bx, \quad (1)$$

wherein y and x may be sequences of corresponding measurement values $y_i$ and $x_i$, respectively. In that case, the fit parameter b, i.e. the slope of the linear function y(x), may be expressed as $$b = \frac{\sum_i (x_i - x_m)(y_i - y_m)}{\sum_i (x_i - x_m)^2}, \quad (2)$$

wherein $x_m$ and $y_m$ are the arithmetic mean values over the sequence of values $x_i$ and $y_i$, respectively. After resolving the products in the numerator and the denominator of Eq. (2), b may be expressed as $$b = \frac{\sum_i (x_i x_m - x_m y_i - x_i y_m + x_m y_m)}{\sum_i (x_i^2 - 2 x_i x_m + x_m^2)}. \quad (3)$$

If $x_i$ and $y_i$ are measured, $x_m$ and $y_m$ may be calculated by calculation of the mean values of the sequences $x_i$ and $y_i$, respectively. Subsequently, the parameter b may be calculated using the expression of Eq. (3). By using Eq. (1) the offset parameter a may then be calculated by $$a = y_m - b x_m. \quad (4)$$

For a testing run of the ADC 101, a voltage ramp may be generated by means of the generation unit 110. A counter unit may be provided to operate a counter. The counter may count arbitrary units of time after starting of the generation of the voltage ramp. For example, the counter may start at the value 0, when the generation of the voltage ramp begins. The voltage ramp may have any slope. The counter values of the counter may represent the variable x. Each value for the variable x may then be put in correspondence to one digital code in the digital output signal at the output 101*b* of the ADC 101 when the generated voltage ramp is input to the input 101*a* of the ADC 101. The sequence of digital codes in the digital output signal may be regarded as sequence for the variable y. That way, pairs $x_i/y_i$ of x- and y-values are formed wherein each pair $x_i/y_i$ corresponds to a pair of the voltage of the analog input signal to the ADC 101 and the respective digital code in the digital output signal to which the voltage of the analog input signal has been converted by the ADC.

At a first value $x_O$ of the counter the ADC 101 will eventually output a first digital code $y_O$ corresponding to a first border of the voltage range the ADC 101 is capable of resolving. In a similar way, at a second value $x_N$ of the counter the ADC 101 will eventually output a second digital code $y_N$ corresponding to a second border of the voltage range the ADC 101 is capable of resolving. The first pair $x_O/y_O$ and the second pair $x_N/y_N$ may be stored in the register of the calculation unit 120 and/or may be output at the output 102 of the chip to an external unit.

For each pair of values $x_i/y_i$ the following terms may be calculated:

$$\Sigma_i x_i = A;$$

$$\Sigma_i y_i = B;$$

$$\Sigma_i x_i y_i = C$$

$$\Sigma_i x_i^2 = D, \qquad (5)$$

wherein the index i may be running from 0 to N and N is the overall number of sample value pairs $x_i/y_i$ collected. That means that during the progression of the testing run, the calculated parameters A, B, C and D may change constantly according to the newly collected sample value pairs.

After finishing the testing run, i.e. when the second pair $x_N/y_N$ is collected, the calculated parameters A, B, C and D may be used to perform a linear regression analysis according to the formulae given in Eq. (3) and (4):

$$b = \frac{C - 2BA/N + BA/N}{D - 2A^2/N + A^2/N} = \frac{C - BA/N}{D - A^2/N}, \text{ and} \qquad (6)$$

$$a = B/N - bA/N. \qquad (7)$$

The calculated parameters a and b may be calculated after the conversion of the voltage ramp using the ADC 101 has been fully finished. In another embodiment, it may also be possible to calculate the parameters a and b "on-the-fly", i.e. after each collection of a pair of sample values $x_i/y_i$ the parameters a and b are determined again. It may be possible to additionally determine the deviation of the current digital output code $y_i$ from the expected digital output code $y_i'$ as extrapolated using the linear regression parameters a and b. The determined deviations may be stored for each digital output code $y_i$ and used for determination of a parameter indicative of the integral non-linearity (INL) of the ADC 101. For example, minimum and maximum values of the determined deviations may be determined and used for determination of the parameter indicative of the integral non-linearity (INL) of the ADC 101. The linear regression parameters a and b may also be used to determine the root-mean-square (RMS) deviation of the sample values $y_i$ from the linear regression.

After converting the voltage ramp using the ADC 101 and calculating the linear regression parameters a and b, a fixed voltage may be provided to the input 101a of the ADC 101. The fixed voltage may for example be generated by the voltage source 113. The switch 114 may be used to selectively apply the voltage generated by the voltage source 113 to the input 101a of the ADC 101. It should be noted that other means for generating a fixed voltage may equally be possible. For example, a fixed voltage of known value may be generated during other tests that may be performed on the chip. The fixed voltage may be generated using a voltage divider. The fixed voltage may be used as a reference source to determine an offset of the linear regression and to calibrate the counter of the counter unit. The fixed voltage may be applied to the input 101a of the ADC 101 and converted to a digital output code. The digital output code may then be used in conjunction with the linear regression parameters a and b to determine an x-value associated with a counter value of the counter unit that corresponds to the fixed voltage, i.e. when the value of the fixed voltage is known, the counter may be calibrated to the actual voltages of the voltage ramp.

In the following an example using fictional values for the counter and the digital output codes is given. It should be obvious to one skilled in the art, that this example is not to be taken in a limiting sense and merely serves as illustration of the underlying principles and methods.

Assuming an ADC with 8 bit resolution and a conversion range of 0 to 1 Volt, the testing run may result in the following values: The start of the generation of the voltage ramp is associated with the counter value 0 and at a counter value of 123 the first digital output code $C_1$, i.e. the digital output code for the minimum conversion value, is retrieved. During the course of the measurement at a counter value 4567 the last digital output code $C_N$, i.e. the digital output code for the maximum conversion value, is retrieved. The first digital output code $C_1$ may be referred to using the index number 0, the last digital output code $C_N$ (for an 8-bit ADC) may be referred to using the index 255. After conversion of the voltage ramp a fixed voltage of 600 mV is converted using the ADC and the ADC outputs a digital output code $C_x$ having the index number 167.

The linear regression yields parameters a and b, the calculation of which is not explicitly detailed herein. Using the linear regression parameters a and b, the digital output code with the index number 167 may be used to determine a counter value, which may be associated with the fixed voltage of 600 mV:

$$(167-a)/b=3008. \qquad (8)$$

That means, that for the counter value of 3008 the value of the voltage ramp was at 600 mV.

The calibrated counter value may be used to determine the gain error $e_G$ and the offset error $e_O$:

$$e_G = 1V \cdot (4567-123) \cdot 600 \text{ mV}/3008 = 886 \text{ mV, and} \qquad (9)$$

$$e_O = 123 \cdot 600 \text{ mV}/3008 = 24 \text{ mV}, \qquad (10)$$

i.e. the ADC converts a voltage of 886 mV to a digital output code that should represent a voltage of 1 V and converts a voltage of 24 mV to a digital output code that should represent a voltage of 0 V.

Figure 2:
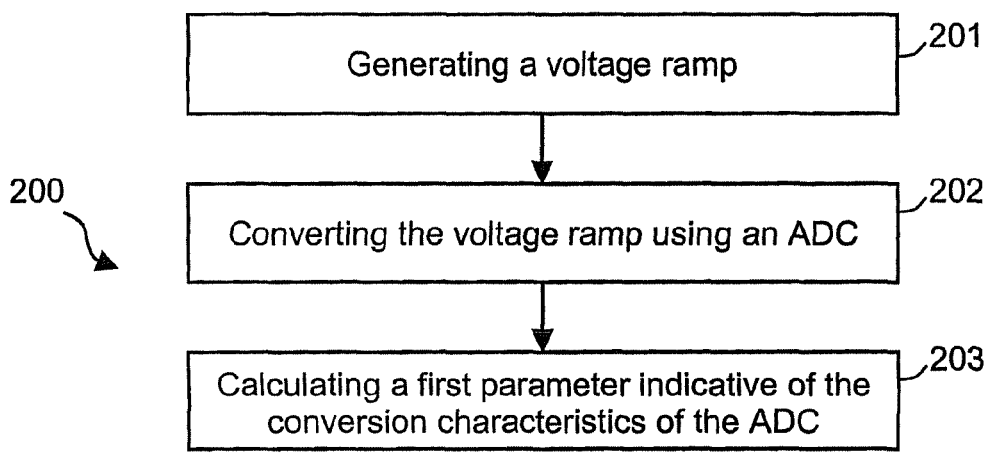
FIG. 2 schematically illustrates one embodiment of a method.

FIG. 2 schematically illustrates a method 200 as one exemplary embodiment. In a process 201, a voltage ramp is generated. In a process 202, the voltage ramp is converted to a digital signal using an analog-to-digital converter at a rate of a clock signal. The clock signal may be used to drive a counter unit. At each tick of the clock signal a digital output code may be generated by the ADC and associated with a respective value of the counter unit. In a process 203, a first parameter may be calculated according to the clock signal and the digital signal on the chip. The first parameter may also be calculated according to the value of the counter unit. The first parameter may be indicative of conversion characteristics of the ADC. It may also be provided that additional parameters may be calculated which may also be indicative of conversion characteristics of the ADC.

Figure 3:
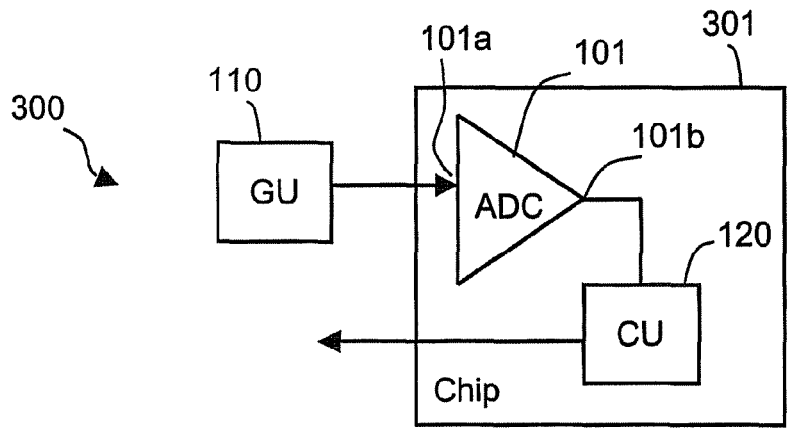
FIG. 3 schematically illustrates another embodiment of a module.

FIG. 3 schematically illustrates one embodiment of a module 300. The module 300 may include a chip 301 having an analog-to-digital converter 101 with an input 101a and an output 101b. The output 101b may be coupled to a calculation unit 120 arranged on the chip 301. The module 300 may include a generation unit 110 coupled to the input 101a of the ADC 101. The generation unit 110 may be configured to generate a voltage ramp and to input the voltage ramp to the input 101a of the ADC 101. The ADC 101 may be configured to convert the voltage ramp to a digital signal and to output the digital signal at the output 101b. The calculation unit 120 may be configured to determine a set of parameters indicative of conversion characteristics of the ADC 101. The calculation unit 120 may be configured to determine the set of parameters according to the voltage ramp generated by the generation unit 110 and the digital signal generated by the ADC 101. The set of parameters may include parameters determined by a linear regression analysis of the voltage ramp and the digital signal. The calculation unit 120 may further include at least one register for storing values of the voltage ramp, values of the digital signal and/or values of the set of parameters. The calculation unit 120 may be configured to output values of the voltage ramp, values of the digital signal and/or values of the set of parameters to external units (not illustrated), in one embodiment external units arranged off the chip 301.

Figure 4:
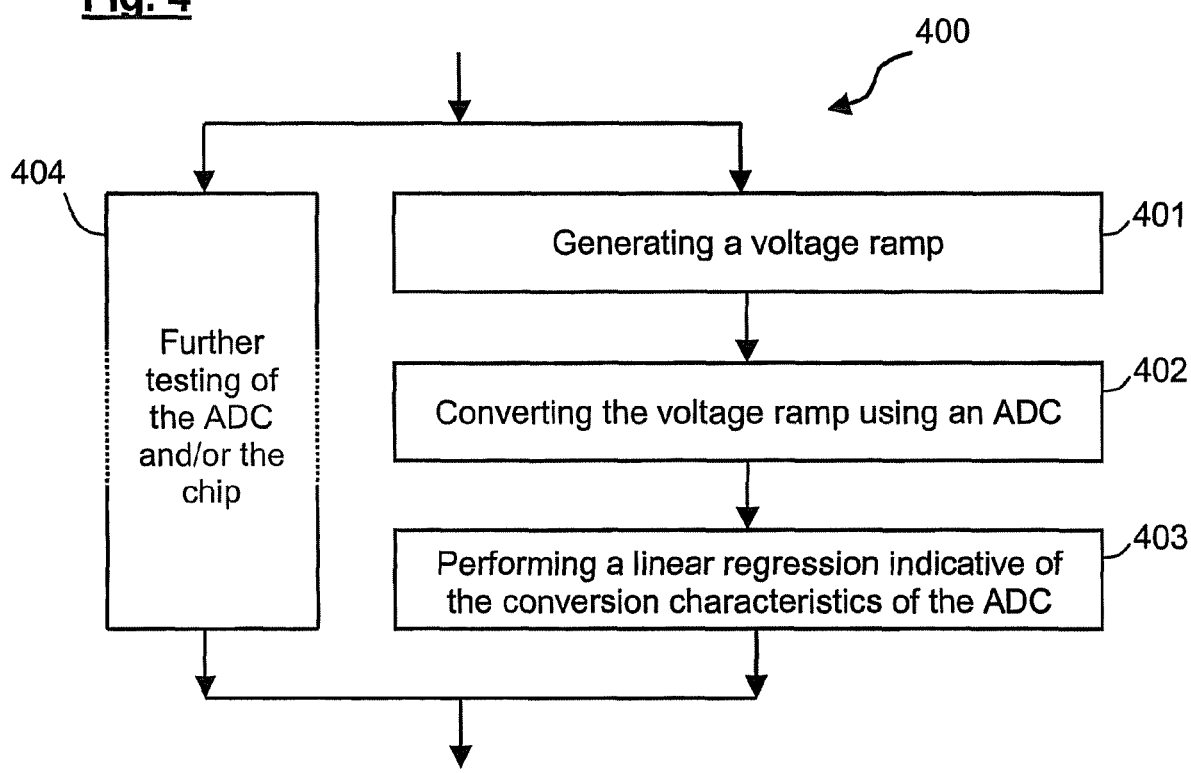
FIG. 4 schematically illustrates another embodiment of a method.

FIG. 4 schematically illustrates a method 400 as one exemplary embodiment. The processes 401, 402 and 403 may be similar to the processes 201, 202 and 203, respectively, of the method 200. The method 400 differs from the method 200 in that the processes 401, 402 and 403 are performed substantially in parallel to a process 404. The process 404 includes testing of an analog-to-digital converter and/or the chip on which the ADC is arranged on. The process 404 may include various testing, such as for example scan tests of the ADC, digital-to-analog converter (DAC) tests, memory tests or similar tests. It should be noted, that a multitude of different tests may be possible which is known to one skilled in the art and that the type of test performed in process 404 is not to be taken in a limiting sense regarding the method 400.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for testing an analog-to-digital converter on a chip, comprising:
   generating a voltage ramp;
   converting the voltage ramp to a digital signal using the analog-to-digital converter at a rate of a clock signal; and
   calculating a first parameter according to the clock signal and the digital signal on the chip, wherein the first parameter is indicative of conversion characteristics of the analog-to-digital converter.

2. The method of claim 1, comprising generating the voltage ramp on the chip.

3. The method of claim 1, generating the voltage ramp further comprising:
   generating the voltage ramp using a capacitor and a DC current source.

4. The method of claim 3, comprising arranging the DC current source on the chip at an input of the analog-to-digital converter.

5. The method of claim 1, further comprising:
   performing a linear regression on the clock signal and the digital signal.

6. The method of claim 5, further comprising:
   calculating a gain parameter and an offset parameter using the results of the linear regression.

7. The method of claim 1, further comprising:
   converting a fixed DC voltage to a further digital signal using the analog-to-digital converter; and
   using the further digital signal to calibrate the results of the linear regression.

8. A chip, comprising:
   a generation unit configured to generate a voltage ramp;
   an analog-to-digital converter configured to convert the voltage ramp generated by the generation unit to a digital signal; and
   a calculation unit configured to calculate a first parameter indicative of conversion characteristics of the analog-to-digital converter according to the voltage ramp and the digital signal.

9. The chip of claim 8, the generation unit comprising:
   a DC current source and a capacitor.

10. The chip of claim 8, comprising wherein the calculation unit is configured to perform a linear regression on the voltage ramp and the digital signal.

11. The chip of claim 10, comprising wherein the calculation unit is configured to calculate a value for the standard deviation of the linear regression.

12. The chip of claim 8, further comprising:
    a reference voltage generation unit configured to generate a reference voltage for calibration of the analog-to-digital converter.

13. The chip of claim 8, further comprising:
    a counter unit configured to operate a counter according to the course of the voltage ramp.

14. The chip of claim 8, comprising wherein the calculation unit is configured to calculate a value for the integral nonlinearity of the analog-to-digital converter.

15. A method for testing an analog-to-digital converter on a chip, comprising:
    generating a voltage ramp;
    converting the voltage ramp to a digital signal using an analog-to-digital converter on a chip; and
    performing a linear regression on the voltage ramp and the digital signal,
    wherein generating the voltage ramp, converting the voltage ramp and performing the linear regression are performed during a further testing of the chip.

16. The method of claim 15, comprising generating the voltage ramp on the chip.

17. The method of claim 15, generating the voltage ramp further comprising:
    generating the voltage ramp using a capacitor and a DC current source.

18. The method of claim 17, comprising arranging the DC current source on the chip at an input of the analog-to-digital converter.

19. The method of claim 15, further comprising:
    calculating a gain parameter and an offset parameter using the results of the linear regression; and
    outputting the gain parameter and the offset parameter at a pin of the chip.

20. The method of claim 15, further comprising:
    converting a fixed DC voltage to a further digital signal using the analog-to-digital converter; and
    using the further digital signal to calibrate the results of the linear regression.

* * * * *